(12) United States Patent
Hasegawa et al.

(10) Patent No.: US 7,880,192 B2
(45) Date of Patent: Feb. 1, 2011

(54) NITRIDE SEMICONDUCTOR LIGHT EMITTING ELEMENT AND NITRIDE SEMICONDUCTOR LIGHT EMITTING DEVICE

(75) Inventors: Yoshiaki Hasegawa, Shiga (JP); Gaku Sugahara, Nara (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 180 days.

(21) Appl. No.: 12/159,786

(22) PCT Filed: Dec. 27, 2006

(86) PCT No.: PCT/JP2006/326097

§ 371 (c)(1),
(2), (4) Date: Jul. 1, 2008

(87) PCT Pub. No.: WO2007/080795

PCT Pub. Date: Jul. 19, 2007

(65) Prior Publication Data

US 2009/0159921 A1    Jun. 25, 2009

(30) Foreign Application Priority Data

Jan. 11, 2006    (JP)    ............... 2006-003374

(51) Int. Cl.
    H01L 21/06    (2006.01)
(52) U.S. Cl. .............. 257/103; 257/101; 257/12; 257/E33.023; 257/E33.056
(58) Field of Classification Search ......... 257/101–103, 257/96–98, 14–17
See application file for complete search history.

(56) References Cited

U.S. PATENT DOCUMENTS

| 2003/0001168 A1* | 1/2003 | Tsuda et al. .......... 257/103 |
| 2003/0165169 A1* | 9/2003 | Nomoto et al. ........ 372/46 |
| 2004/0026710 A1 | 2/2004 | Tsuda et al. |

(Continued)

FOREIGN PATENT DOCUMENTS

JP    6-079172    11/1994

(Continued)

OTHER PUBLICATIONS

International Search Report for corresponding Application No. PCT/JP2006/326097 dated Mar. 13, 2007.

*Primary Examiner*—Dung A. Le
(74) *Attorney, Agent, or Firm*—Renner, Otto, Boisselle & Sklar, LLP

(57) ABSTRACT

A nitride semiconductor device according to the present invention includes a n-GaN substrate 10 and a semiconductor multilayer structure arranged on the principal surface of the n-GaN substrate 10 and including a p-type region, an n-type region and an active layer between them. An $SiO_2$ layer 30 with an opening and a p-side electrode, which makes contact with a portion of the p-type region of the semiconductor multilayer structure, are arranged on the upper surface of the semiconductor multilayer structure. An n-side electrode 36 is arranged on the back surface of the substrate 10. The p-side electrode includes a p-side contact electrode 32 that contacts with the portion of the p-type region and a p-side interconnect electrode 34 that covers the p-side contact electrode 2 and the $SiO_2$ layer 30. Part of the p-side contact electrode 32 is exposed under the p-side interconnect electrode 34.

10 Claims, 12 Drawing Sheets

U.S. PATENT DOCUMENTS

2004/0232439 A1 * 11/2004 Gibb et al. .................. 257/103

FOREIGN PATENT DOCUMENTS

| JP | 2000-277846 | 10/2000 |
| JP | 2001-298243 | 10/2001 |
| JP | 3650000 | 1/2002 |
| JP | 2002-158405 | 5/2002 |
| JP | 2003-229631 | 8/2003 |

* cited by examiner (a)

10 — TOP SURFACE OF WAFER

RIDGE STRIPE — 50

(b)

36 — BACK SURFACE OF WAFER

36

10

42    44

(a)

(b)

NITRIDE SEMICONDUCTOR LIGHT EMITTING ELEMENT AND NITRIDE SEMICONDUCTOR LIGHT EMITTING DEVICE

TECHNICAL FIELD

The present invention relates to a nitride semiconductor light-emitting element, a nitride semiconductor light-emitting device, and methods for fabricating such a device.

BACKGROUND ART

A blue-violet semiconductor laser diode, made of Group III-V nitride semiconductors $Al_xGa_yIn_{1-x-y}N$ (where $0 \leq x \leq 1$ and $0 \leq y \leq 1$) such as gallium nitride (GaN), is a key device that would enable optical disc drives to perform a write operation with extremely high densities, and is going to be introduced into actual products in increasing numbers. To develop new industrial fields of applications, it is indispensable to further increase the output power of such a blue-violet semiconductor laser diode because that would contribute to not only getting writing on optical discs done at even higher speeds but also applying it to laser displays.

Recently, a GaN substrate is expected to be more useful in making a nitride semiconductor light-emitting device than any other substrate. This is because a GaN substrate is superior to a conventional sapphire substrate in terms of the degree of lattice matching between crystals and heat dissipation property. What is more, although a sapphire substrate is electrically insulating, a GaN substrate is electrically conductive. This means that a structure in which current flows across the GaN substrate can be adopted by providing an electrode on the back surface of the GaN substrate. Also, if there is an electrode on the back surface of an electrically conductive GaN substrate, the size (i.e., chip area) of each semiconductor device can be reduced, which would increase the total number of chips that can be cut out of a single wafer, thus cutting down the manufacturing cost significantly. Actually, however, a significant quantity of heat would be generated when a light-emitting device such as a semiconductor laser diode is operated at high temperatures to provide high output power. That is why the light-emitting device should be accurately mounted on a heatsink.

Such a semiconductor laser, in which a light-emitting device (e.g., a semiconductor laser diode, among other things) that has been fabricated on a GaN substrate is mounted on a heatsink, is disclosed in Patent Documents Nos. 1 and 2, for example.

Patent Document No. 1: Japanese Patent No. 3650000
Patent Document No. 2: Japanese Patent Application Laid-Open Publication No. 2003-229631

DISCLOSURE OF INVENTION

Problems to be Solved by the Invention

In mounting a huge number of light-emitting elements (or chips), which have been fabricated on a GaN wafer, using an automatic recognizer, if those chips were automatically mounted by sensing the four corners of the chips as in a conventional mass-mounting machine, then the yield would be poor. The reason is that as GaN crystals are hexagonal ones, the four corners of those chips are not always rectangular. On top of that, the transparency of the GaN wafer will make it even more difficult to recognize the chips automatically and will further decrease the yield.

According to the conventional technique disclosed in Patent Document No. 1, the electrodes on the top surface and the back surface of the substrate have mutually different patterns to increase the yield of mounting. Meanwhile, according to the conventional technique disclosed in Patent Document No. 2, they attempt to increase the yield of mounting using the dislocated portions of a GaN substrate as a sort of alignment marks.

However, not every GaN substrate has a regular arrangement of dislocations but some GaN substrates will have a random arrangement of dislocations. On top of that, a GaN wafer with only a few dislocations should be available in the near future. In that case, it would be difficult to use that small number of dislocated portions of a GaN wafer as alignment marks. Also, the present inventors discovered that when the technique of providing electrodes with different shapes of end facets for the top and back surfaces of a substrate was applied to a light-emitting device that should operate at high temperatures and to provide high output powers, the quantity of heat dissipated from the end facets and their surrounding portions was no longer insufficient. In that case, those end facets would deteriorate due to local generation of heat and it would be difficult to produce, with a good yield, such light-emitting devices that could operate at high temperatures and to provide high output powers.

In order to overcome the problems described above, the present invention has an object of providing a nitride semiconductor light-emitting device that can operate at high temperatures and with high output powers and yet can be produced with a good yield and also providing a method for fabricating such a device.

Means for Solving the Problems

A nitride semiconductor device according to the present invention includes: a nitride-based semiconductor substrate including an n-type dopant; a semiconductor multilayer structure, which is arranged on the principal surface of the semiconductor substrate and which includes a p-type region, an n-type region and an active layer sandwiched between the p- and n-type regions; an insulating film, which has been deposited on the upper surface of the semiconductor multilayer structure and which has an opening; a p-side electrode, which is arranged over the upper surface of the semiconductor multilayer structure and which makes contact with a portion of the p-type region of the semiconductor multilayer structure at the opening of the insulating film; and an n-side electrode, which is arranged on the back surface of the semiconductor substrate. The p-side electrode includes a first p-side electrode layer that contacts with the portion of the p-type region and a second p-side electrode layer that has been stacked on the first p-side electrode layer so as to cover the first p-side electrode layer. Part of the first p-side electrode layer is exposed under the second p-side electrode layer.

In one preferred embodiment, that part of the first p-side electrode layer that is exposed under the second p-side electrode layer is not located over the opening.

In another preferred embodiment, multiple parts of the first p-side electrode layer are exposed under the second p-side electrode layer.

In still another preferred embodiment, the insulating film has a striped opening and multiple parts of the first p-side electrode layer are exposed under the second p-side electrode layer on two opposite sides of the opening of the insulating film.

In yet another preferred embodiment, the insulating film has a striped opening and multiple parts of the first p-side electrode layer are exposed under the second p-side electrode layer on two opposite sides of the opening of the insulating film.

In yet another preferred embodiment, the uppermost layer of the first p-side electrode layer has different hue, saturation and/or lightness from that of the second p-side electrode layer.

In yet another preferred embodiment, the respective uppermost layers of the first and second p-side electrode layers and the insulating film have mutually different reflectances.

A method for fabricating a nitride semiconductor device according to the present invention includes the steps of: providing the nitride semiconductor light-emitting element of the present invention; and mounting the nitride semiconductor light-emitting element on a heatsink while sensing which part of the first p-side electrode layer is exposed under the second p-side electrode layer.

In one preferred embodiment, the step of mounting includes mounting the nitride semiconductor element on the heatsink such that the back surface of its semiconductor substrate contacts with the heatsink.

A semiconductor light-emitting device according to the present invention includes: a heatsink; and the semiconductor light-emitting element of the present invention, which is arranged on the heatsink.

In one preferred embodiment, the semiconductor light-emitting element is mounted on the heatsink such that the back surface of its semiconductor substrate contacts with the heatsink.

Effects of the Invention

According to the present invention, a nitride semiconductor light-emitting element (e.g., a semiconductor laser diode, in particular) can be positioned with the shape and color of its p-side electrode recognized. Also, by positioning the nitride semiconductor light-emitting element with the shape and color of its p-side electrode recognized, a huge number of light-emitting elements can be mounted at a time much more easily. As a result, light-emitting devices can be fabricated with an increased yield and at a reduced cost.

Figure 3:
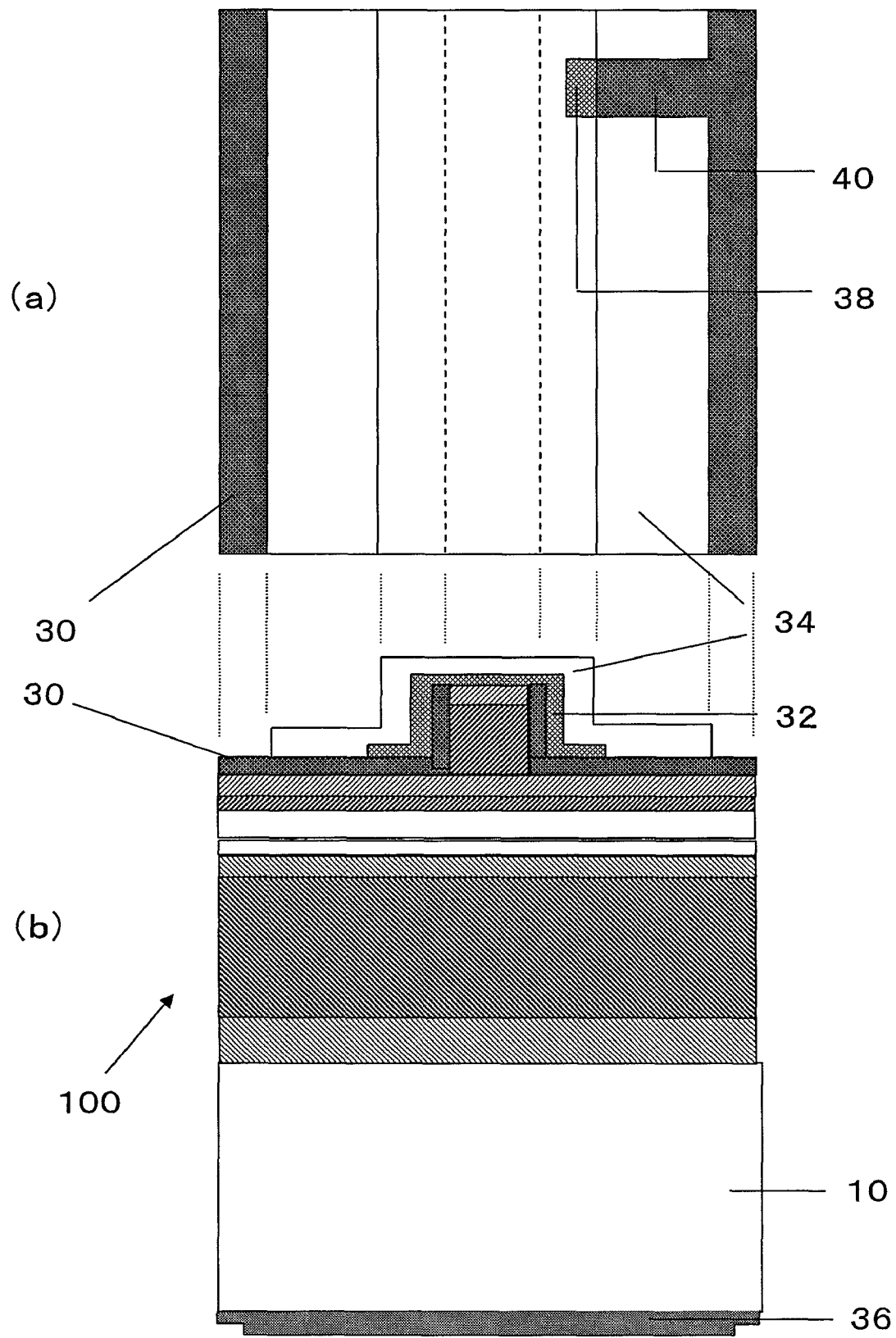

Portion (a) of FIG. 3 is a top view illustrating the nitride semiconductor device as the first preferred embodiment and portion (b) of FIG. 3 is a cross-sectional view thereof.

Figure 4:
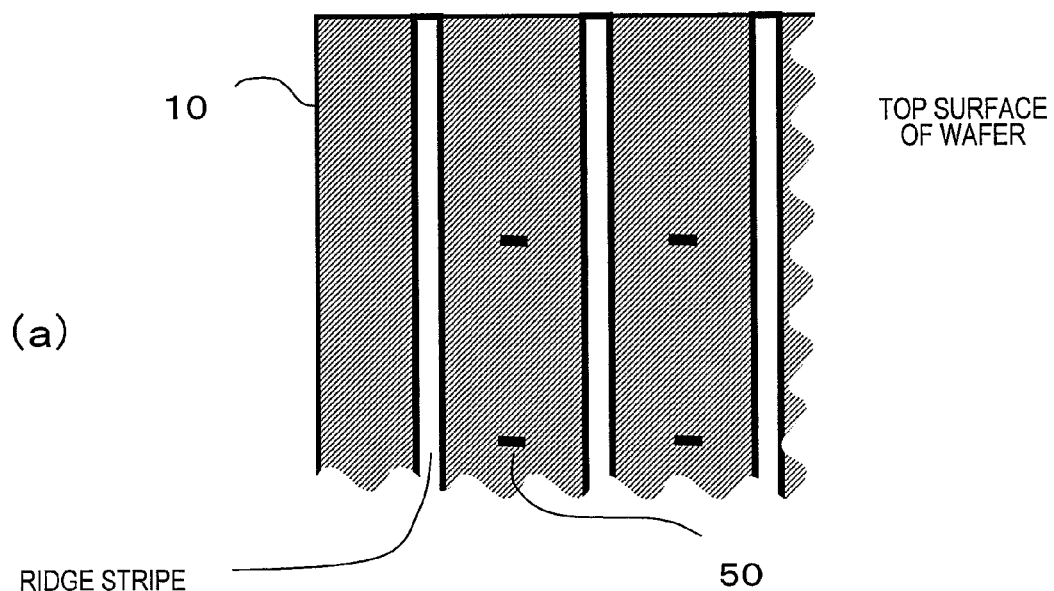
Figure 4:
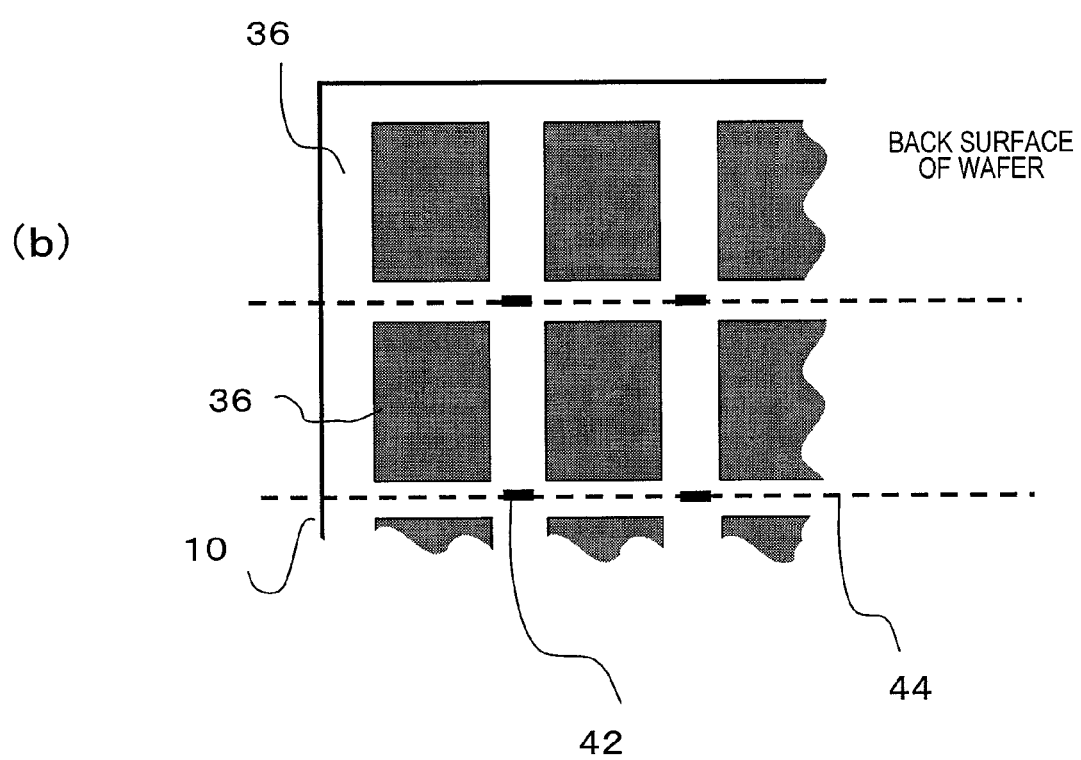

FIGS. 4(a) and 4(b) are plan views schematically illustrating a primary cleavage process.

Figure 5:
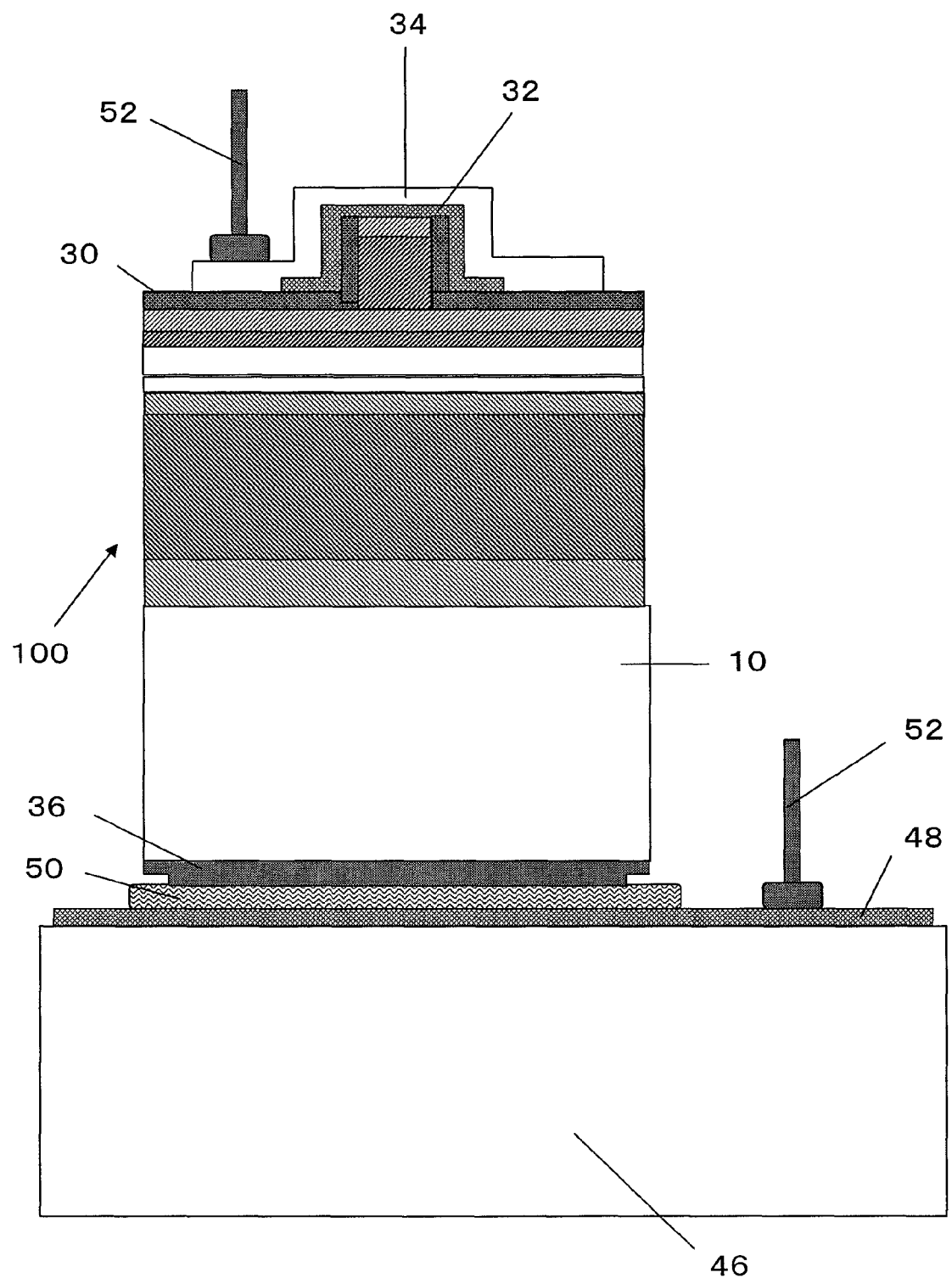

FIG. 5 is a cross-sectional view illustrating how the nitride semiconductor device of the first preferred embodiments looks when mounted.

Figure 6:
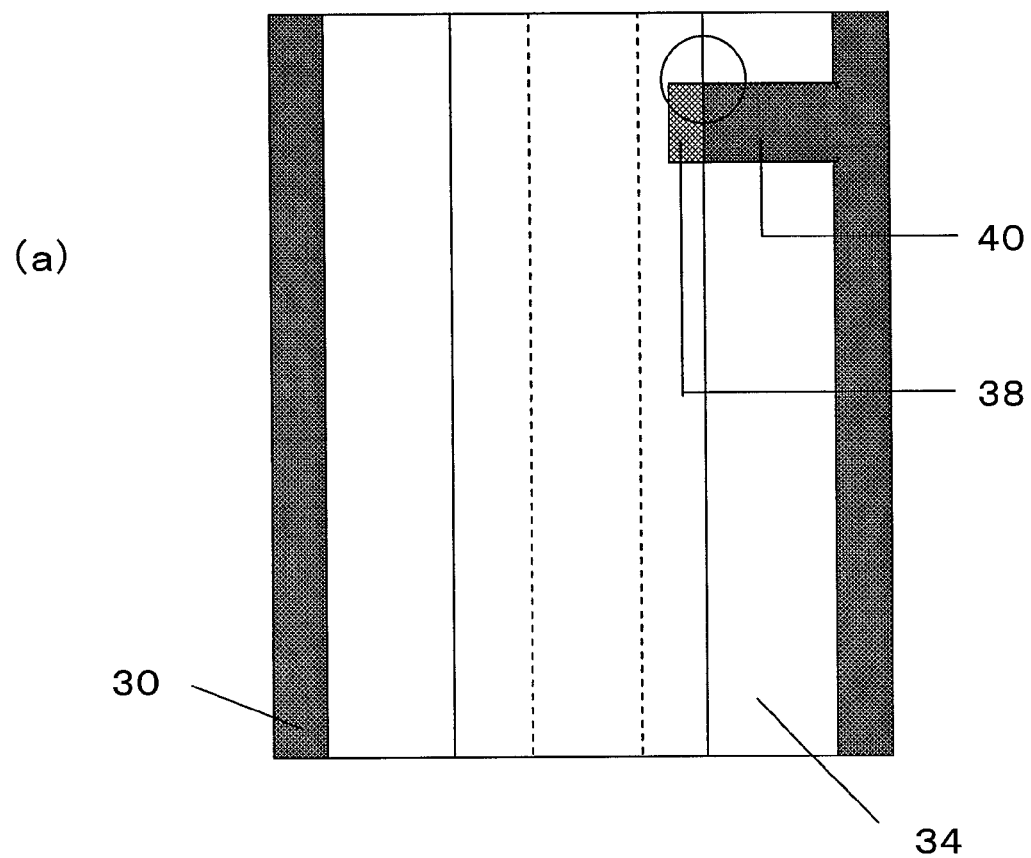
Figure 6:
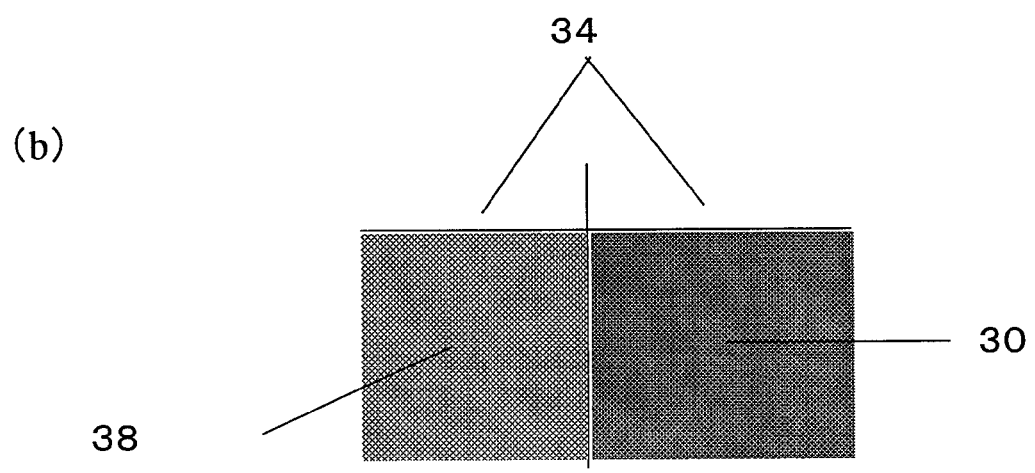

FIG. 6(a) is a top view illustrating the nitride semiconductor device of the first preferred embodiment and FIG. 6(b) illustrates the encircled portion of FIG. 6(a) on a larger scale.

Figure 7:
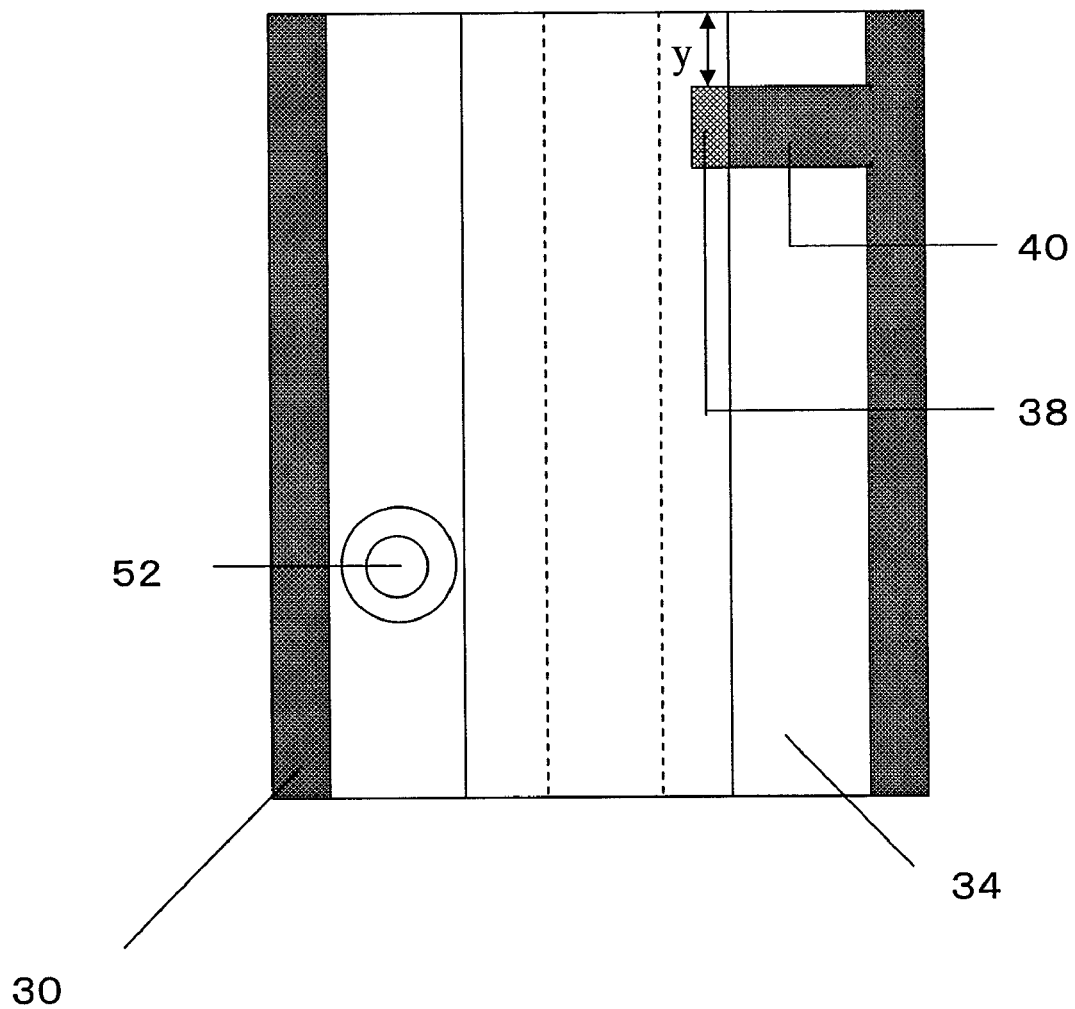

FIG. 7 is a top view illustrating how the nitride semiconductor device of the first preferred embodiments looks when mounted.

Figure 8:
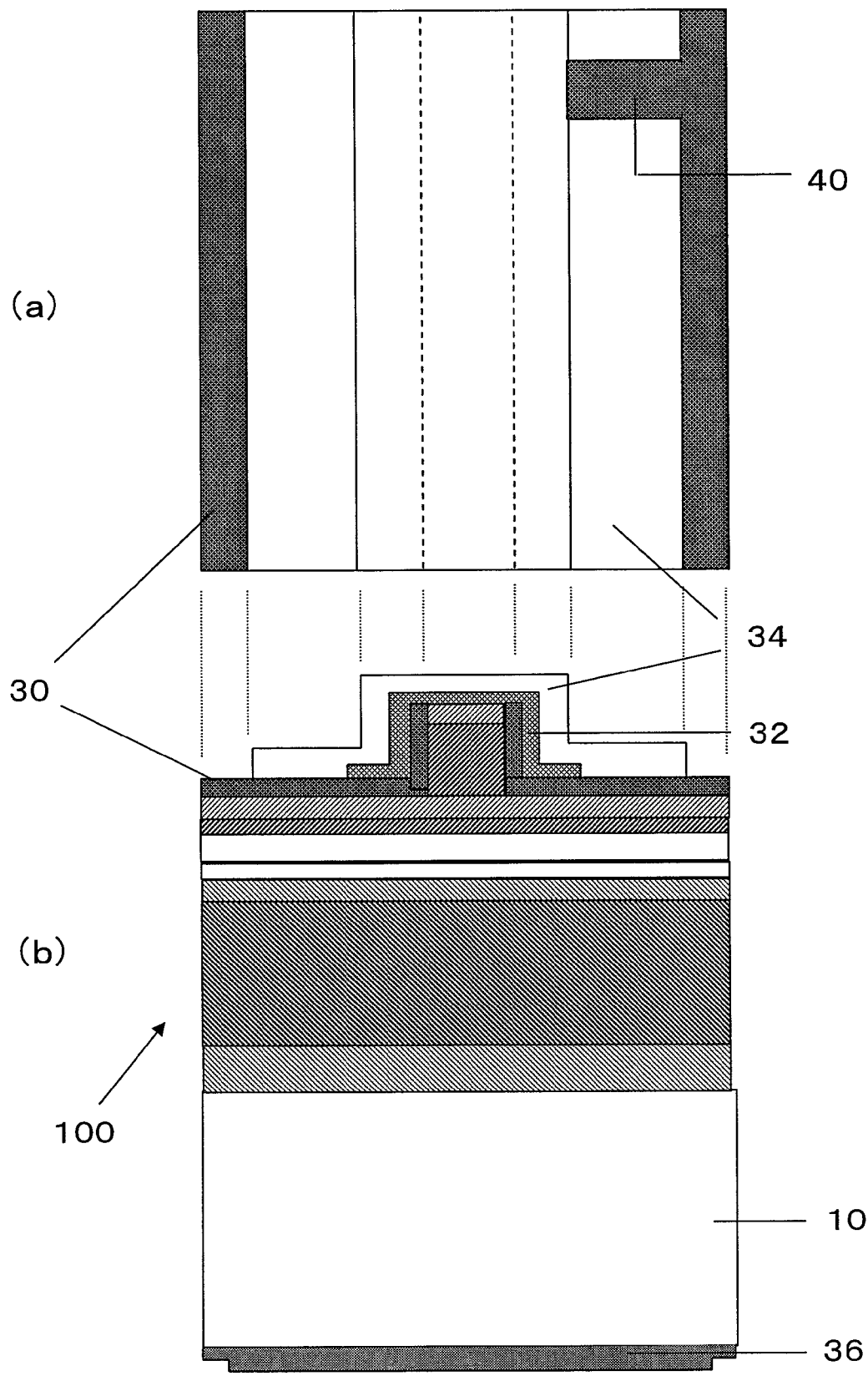

Portion (a) of FIG. 8 is a top view illustrating a comparative example for the nitride semiconductor device as the first preferred embodiment and portion (b) of FIG. 8 is a cross-sectional view thereof.

Figure 9:
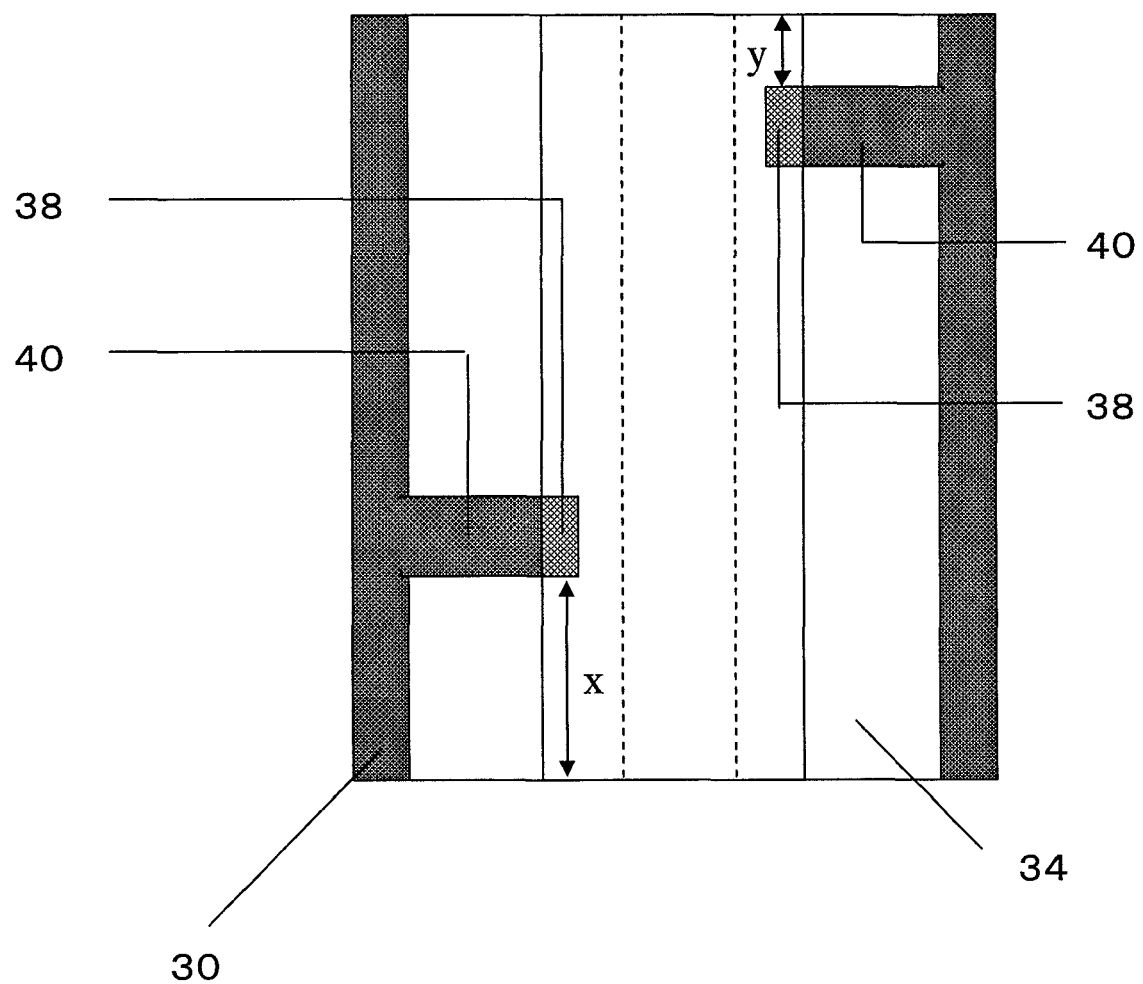

FIG. 9 is a top view illustrating a second preferred embodiment of a nitride semiconductor device according to the present invention.

Figure 10:
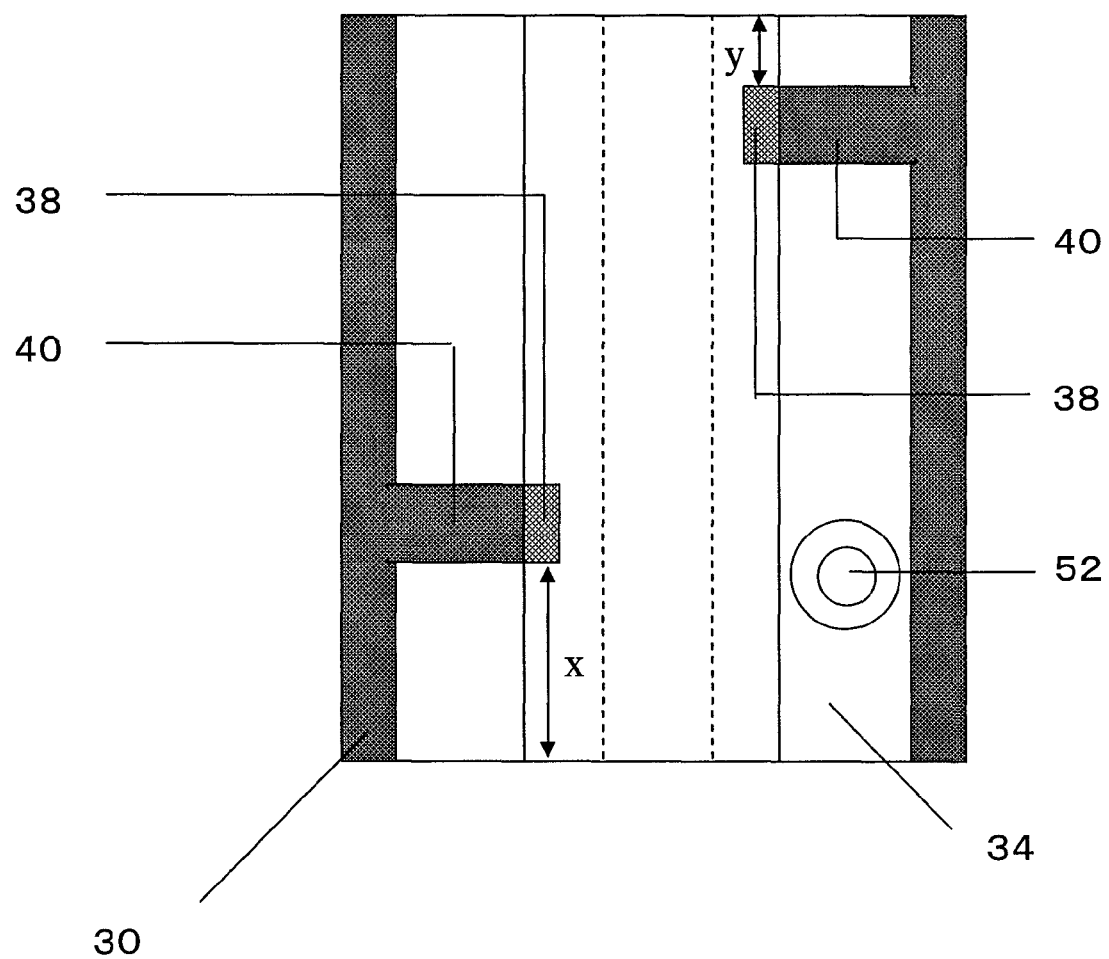

FIG. 10 is a top view illustrating how a modified example of the nitride semiconductor device as the second preferred embodiment of the present invention looks when mounted.

Figure 11:
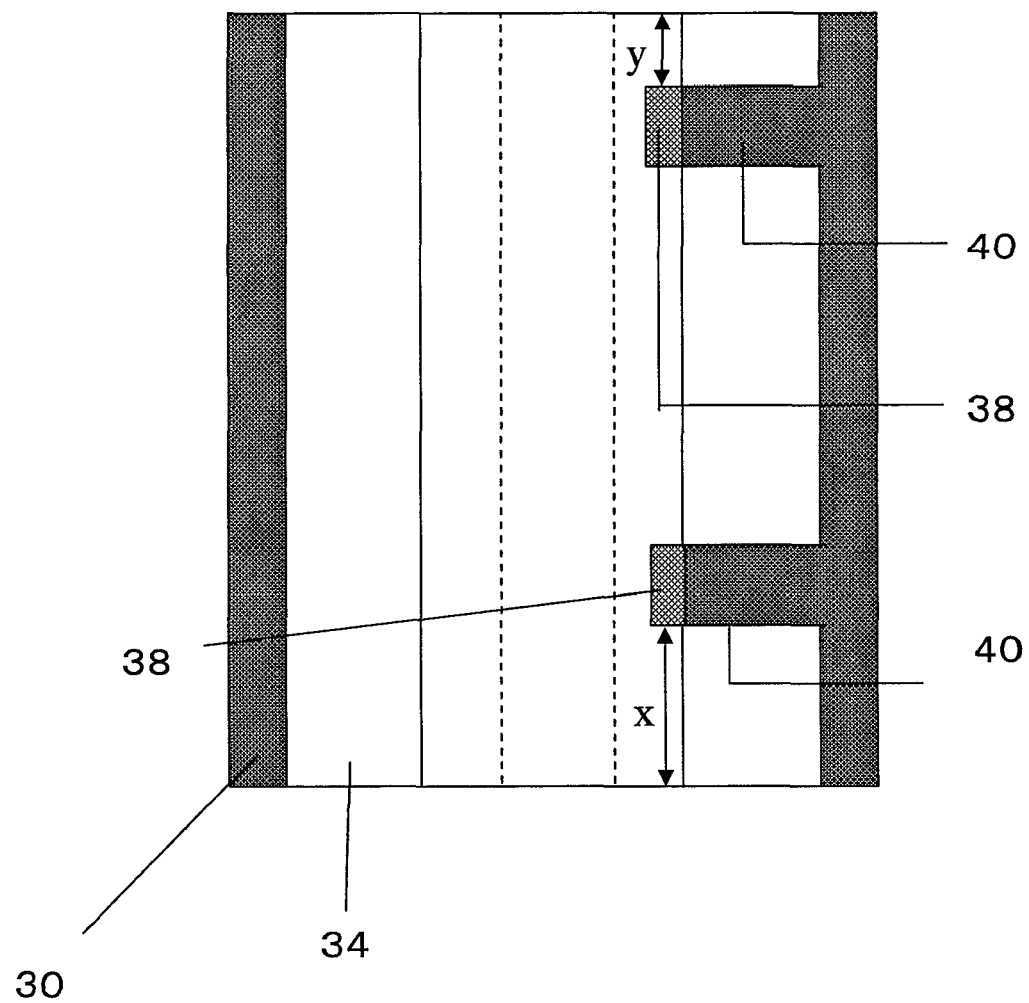

FIG. 11 is a top view illustrating a third preferred embodiment of a nitride semiconductor device according to the present invention.

Figure 12:
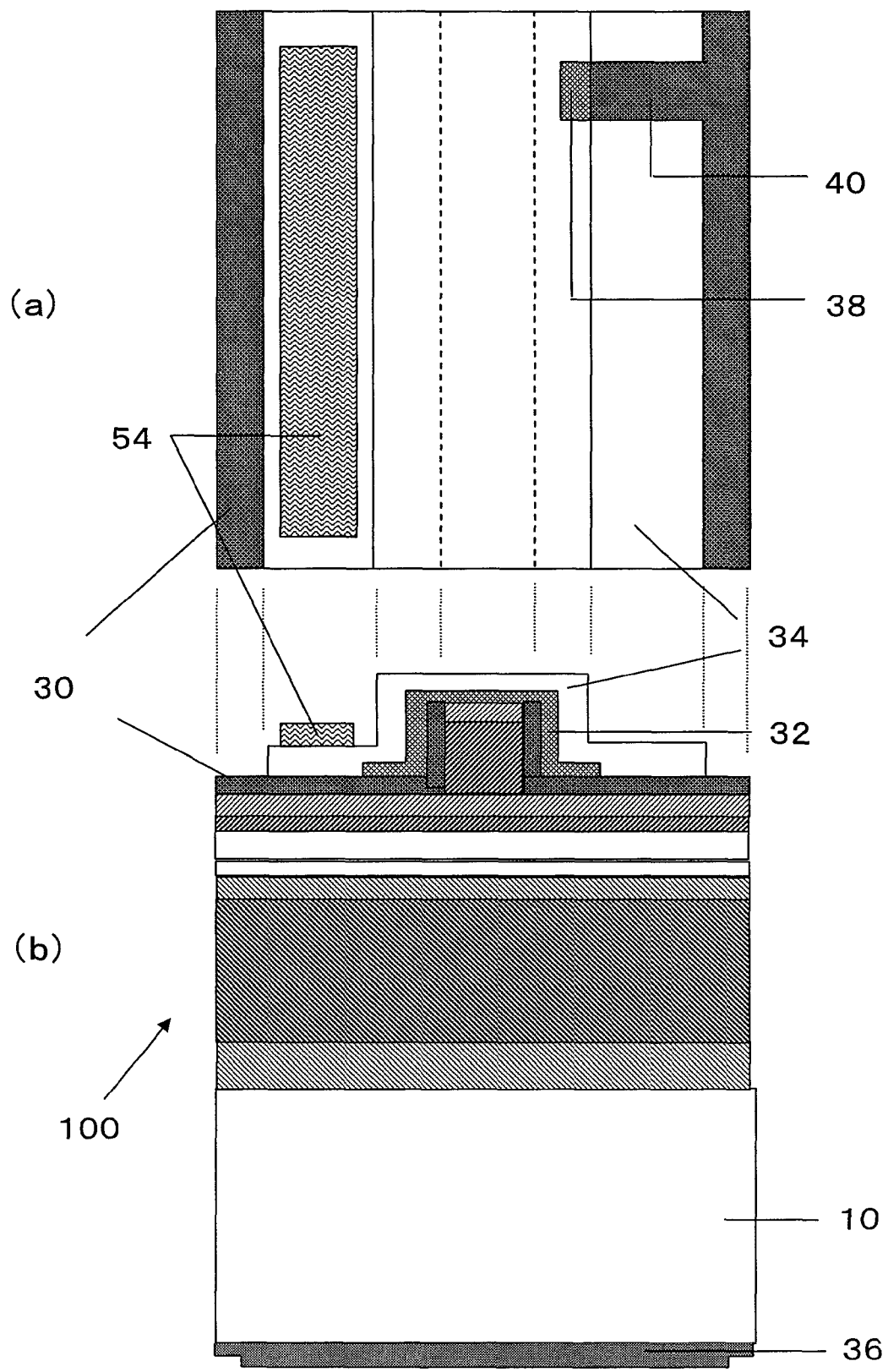

Portion (a) of FIG. 12 is a top view illustrating a fourth preferred embodiment of a nitride semiconductor device according to the present invention and portion (b) of FIG. 12 is a cross-sectional view thereof.

DESCRIPTION OF REFERENCE NUMERALS 10 n-type GaN substrate
12 n-type GaN layer
14 n-type AlGaN cladding layer
16 GaN optical guide layer
18 InGaN multi-quantum well layer
20 InGaN intermediate layer
22 p-type AlGaN cap layer
24 p-type GaN optical guide layer
26 p-type AlGaN cladding layer
28 p-type GaN contact layer
30 $SiO_2$ layer
32 p-side contact electrode (Pd/Pt)
34 p-side interconnect electrode (Ti/Pt/Au)
36 n-side electrode (Ti/Pt/Au)
38 p-side contact electrode exposed portion
40 p-side interconnect electrode recessed portion
42 cleavage guide
44 primary cleavage line
46 sub-mount
48 on-sub-mount interconnect electrode
50 solder
52 Au wire
54 Au-based pad electrode
100 semiconductor multilayer structure

BEST MODE FOR CARRYING OUT THE INVENTION

Figure 1:
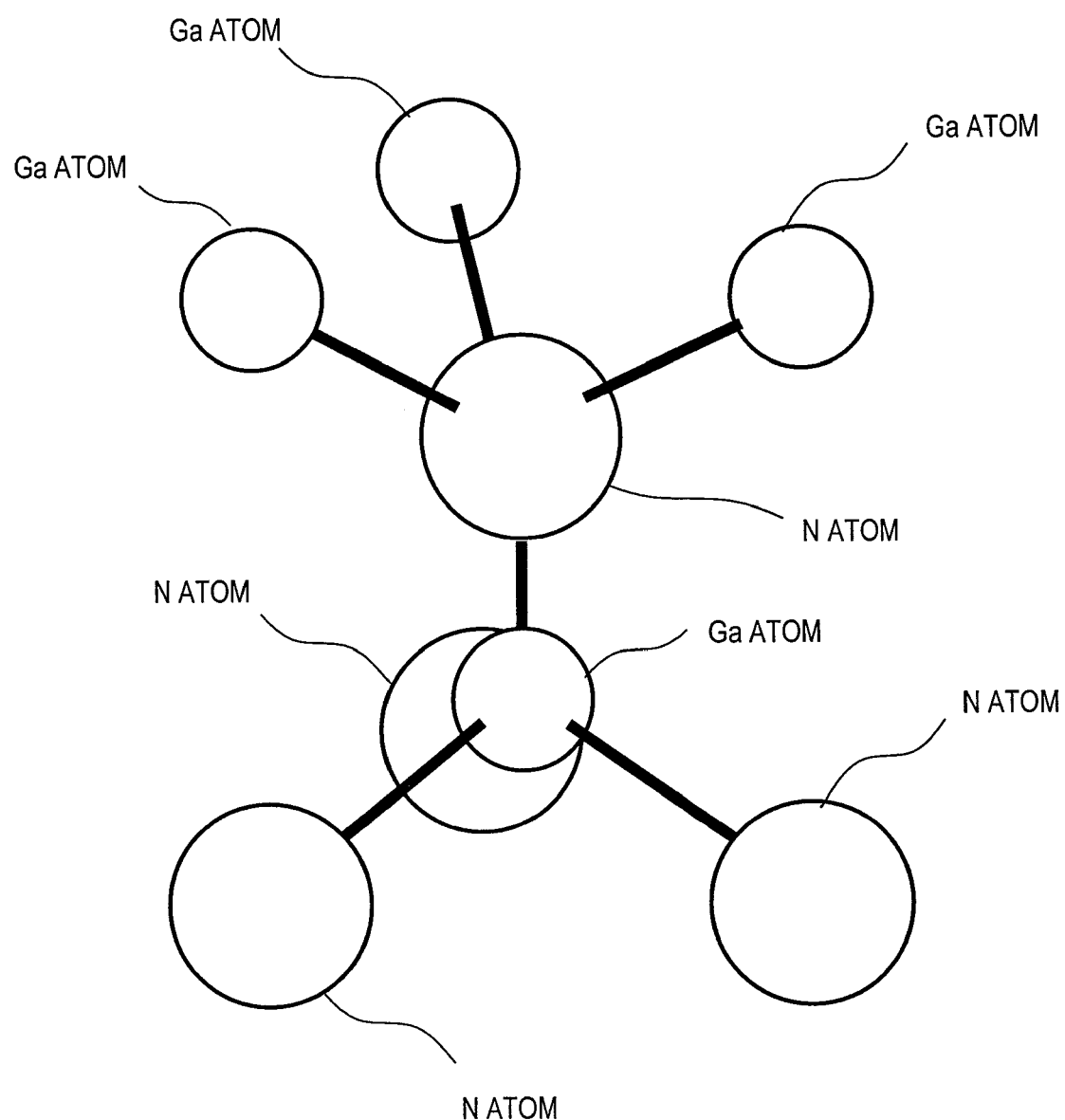
FIG. 1 is a perspective view schematically illustrating the GaN crystal structure of a GaN wafer.

As shown in FIG. 1, a GaN crystal consists of Ga atoms and N atoms and has a hexagonal structure. The top surface of a GaN wafer, on which various types of semiconductor layers will grow epitaxially, is an arrangement of Ga atoms that form a layer with a two-dimensional plane. Thus, that top surface is sometimes called a "Ga plane" or a "+C polarity plane". On the other hand, the back surface of a GaN wafer is an arrangement of nitrogen (N) atoms that also form a layer with a two-dimensional plane. Thus, that back surface is sometimes called a "nitrogen plane" or a "−C polarity plane". Since a GaN wafer has a hexagonal structure, it is very difficult to carry out the process step of cleaving the GaN wafer into respective semiconductor chips with a substantially rectangular parallelepiped shape at a good yield. That is why if a chip needs to be automatically positioned and mounted on a heatsink with the four corners of the cleaved chip recognized, then the resultant yield would be poor. The reason is that as GaN crystals are hexagonal ones, the four corners of the chips are not always rectangular. On top of that, the transparency of the GaN wafer will make it even more difficult to recognize the chips automatically and will further decrease the yield.

A junction-down mounting technique can dissipate a lot of heat because the chip is mounted with its active layer, which generates the heat and which defines a pn junction, arranged closer to a heatsink. Considering how difficult it is to mount a chip with a GaN substrate automatically, however, a junction-up mounting technique will increase the yield more effectively because a chip is supposed to be mounted with its active layer arranged more distant from the heatsink. This is because according to the junction-up mounting technique, the light-emitting end facet of the laser diode is located more distant from the heatsink, thus reducing the risk of depositing solder on the light-emitting end facet by mistake during the mounting process step. Besides, according to the junction-up mounting technique, the heat can be dissipated uniformly from the entire back surface of the GaN substrate, thus minimizing the local deterioration due to the generation of heat in a narrow area. That is why this mounting technique is effectively applicable to a device that needs to operate at high temperatures and with high output powers.

Hereinafter, it will be described how to fabricate a nitride semiconductor light-emitting element according to the present invention.

According to the present invention, first of all, a semiconductor multilayer structure is formed on the surface (i.e., the Ga plane) of a nitride semiconductor wafer by a known semiconductor crystal growing process including an epitaxy process. The semiconductor multilayer structure includes a p-type region and an n-type region. In making a light-emitting element such as a semiconductor laser diode, the semiconductor multilayer structure will have a double heterostructure and a structure to confine light and current in a certain space.

Next, on the top surface of the nitride wafer, a p-side electrode is formed so as to make electrical contact with the p-type region of the semiconductor multilayer structure and then an n-side electrode is formed on the back surface of the nitride semiconductor wafer.

In a preferred embodiment of the present invention, the p-side electrode includes a contact electrode, a part of which contacts with the p-type region of the semiconductor multilayer structure, and an interconnect electrode that supplies current to the contact electrode.

The present inventors discovered and confirmed via experiments that the automatic mounting could get done most efficiently if the interconnect electrode was formed so as to partially expose the contact electrode. We also discovered that it was even more effective if that exposed part of the contact electrode was located on one of the two end facets of the laser resonant cavity.

By adopting this arrangement, the nitride semiconductor elements that need to operate at high temperatures and with high output powers can be mounted with a significantly increased yield and can be mass-produced at a reduced cost.

EMBODIMENT 1

Hereinafter, a first preferred embodiment of a nitride semiconductor element according to the present invention and a method for fabricating such a semiconductor element will be described with reference to the accompanying drawings.

Figure 2:
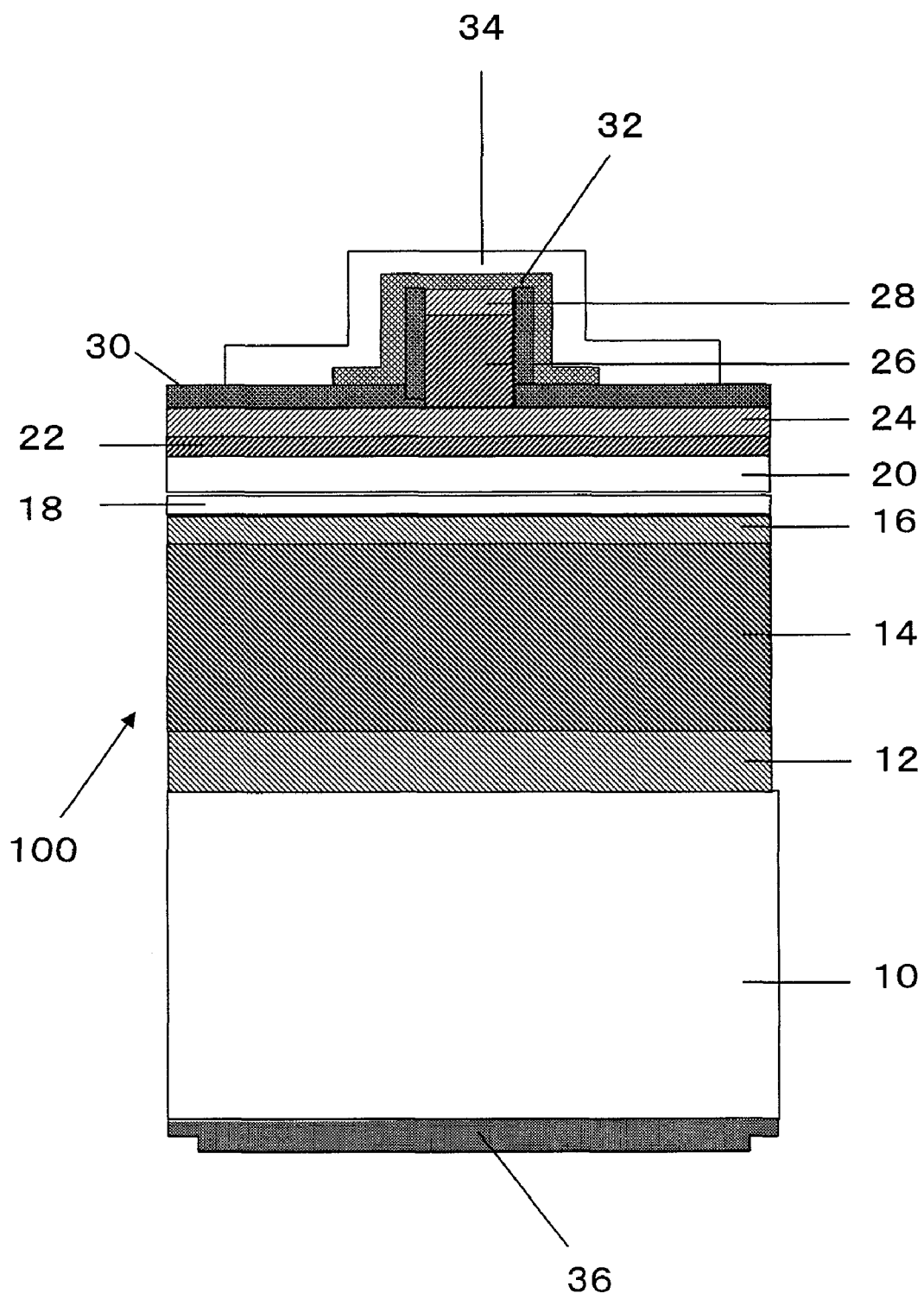
FIG. 2 is a cross-sectional view illustrating a first preferred embodiment of a nitride semiconductor device according to the present invention.

First, referring to FIG. 2, illustrated schematically is a cross section of a nitride semiconductor element as a preferred embodiment of the present invention, which is implemented as a GaN based semiconductor laser diode in this example. The cross section of the element shown in FIG. 2 is viewed on a plane that is parallel to one end facet of the resonant cavity. That is to say, the resonant cavity length direction is perpendicular to this cross section.

The semiconductor laser diode of this preferred embodiment includes an n-type GaN substrate 10 with a thickness of about 100 µm, which is doped with an n-type dopant, and a semiconductor multilayer structure 100 that has been formed on the top surface (i.e., the Ga plane) of the n-type GaN substrate 10.

The semiconductor multilayer structure 100 includes an n-type GaN layer 12, an n-type AlGaN cladding layer 14, a GaN optical guide layer 16, an InGaN multi-quantum well layer 18, an InGaN intermediate layer 20, a p-type AlGaN cap layer 22, a p-type GaN optical guide layer 24, a p-type AlGaN cladding layer 26 and a p-type GaN contact layer 28.

These semiconductor layers included in the semiconductor multilayer structure 100 of this preferred embodiment may have the dopant concentrations and thicknesses shown in the following Table 1:

TABLE 1

| Semiconductor layer | Dopant concentration (cm$^{-3}$) | Thickness |
|---|---|---|
| n-GaN layer 12 | Si: $5 \times 10^{17}$ | 1 µm |
| n-AlGaN cladding layer 14 | Si: $5 \times 10^{17}$ | 1.5 µm |
| GaN optical guide layer 16 | | 160 nm |
| InGaN multi-quantum well layer 18 | | 3 nm (active layer)/ 9 nm (barrier layer) |
| InGaN intermediate layer 20 | | 60 nm |
| p-AlGaN cap layer 22 | Mg: $1 \times 10^{19}$ | 20 nm |
| p-GaN optical guide layer 24 | Mg: $1 \times 10^{19}$ | 20 nm |
| p-AlGaN cladding layer 26 | Mg: $1 \times 10^{19}$ | 0.5 µm |
| p-GaN contact layer 28 | Mg: $1 \times 10^{19}$ | 0.1 µm |

It should be noted that the dopants, the dopant concentrations and the thicknesses of the respective semiconductor layers shown in this Table 1 are just examples and are never intended to limit the scope of the present invention.

In this semiconductor multilayer structure 100, the p-type GaN contact layer 28 and the p-type AlGaN cladding layer 26 have been patterned into a ridge stripe shape so as to run in the resonant cavity length direction. The ridge stripe may have a width of about 1.5 µm and the resonant cavity may have a length of 600 µm, for example. The chip width (i.e., a size of the element as measured parallel to the respective semiconductor layers shown in FIG. 2) may be 200 µm, for example.

The upper surface of the semiconductor multilayer structure 100 is entirely covered with an insulating film 30 (which is an SiO$_2$ layer in this preferred embodiment) except the upper surface of the ridge stripe. And a striped opening has been cut through the center portion of the SiO$_2$ layer 30 so as to expose the upper surface of the ridge stripe. Through that opening of the SiO$_2$ layer 30, the surface of the p-type GaN contact layer 28 makes contact with the p-side contact electrode (Pd/Pt) 32. And a p-side interconnect electrode (Ti/Pt/Au) 34 is arranged so as to cover the entire upper surface of the p-side contact electrode 32. In preferred embodiment, the p-side contact electrode 32 and the p-side interconnect electrode 34 together form a p-side electrode and are equivalent to the first and second p-side electrode layers as defined in the claims. It should be noted that the back surface of the n-type GaN substrate 10 contacts with an n-side electrode (Ti/Pt/Au) 36.

Hereinafter, a preferred embodiment of a method for fabricating the nitride semiconductor device of this preferred embodiment will be described.

First, an n-type GaN wafer 10 that has been made by a conventional process is provided. The n-type GaN wafer 10 may have a thickness of approximately 400 μm, for example. The top surface of the n-type GaN wafer 10 has been planarized by a polishing process.

Next, a semiconductor multilayer structure 100 is formed on the top surface of the n-type GaN wafer 10. The semiconductor multilayer structure 100 may be formed by a known epitaxial growth technique. The respective semiconductor layers may be grown in the following manner, for example.

First, the n-type GaN wafer 10 is loaded into the chamber of a metalorganic vapor phase epitaxy (MOVPE) system. After that, the surface of the n-type GaN wafer 10 is subjected to a heat treatment (i.e., thermal cleaning) at a temperature of approximately 500 to 1,100° C. This heat treatment may be carried out at 800° C. for at least one minute, preferably five minutes or more. While this heat treatment is being conducted, a gas including nitrogen (N) atoms (such as $N_2$, $NH_3$ or hydrazine gas) is preferably supplied into the chamber.

Thereafter, with the temperature of the reaction furnace controlled at about 1,000° C., trimethylgallium (TMG) and ammonia ($NH_3$) as source gases and hydrogen and nitrogen as carrier gases are supplied simultaneously and silane ($SiH_4$) gas is also supplied as an n-type dopant, thereby growing an n-type GaN layer 12 with an Si concentration of about $5\times10^{17}$ $cm^{-3}$ to a thickness of approximately 1 μm.

Next, with trimethylaluminum (TMA) also supplied, an n-type AlGaN cladding layer 14, made of $Al_{0.04}Ga_{0.96}N$ with an Si concentration of about $5\times10^{17}$ $cm^{-3}$, is grown to a thickness of approximately 1.5 μm. Subsequently, a GaN optical guide layer 16 made of GaN is grown to a thickness of approximately 160 nm. After that, the temperature is lowered to around 800° C., the carrier gases are changed from hydrogen into nitrogen, and trimethylindium (TMI) and TMG are supplied, thereby alternately growing three quantum well layers of $In_{0.1}Ga_{0.9}N$ to a thickness of approximately 3 nm each and two $In_{0.02}Ga_{0.98}N$ barrier layers to a thickness of approximately 9 nm each to make a multi-quantum well active layer 18. Thereafter, an InGaN intermediate layer 20 of $In_{0.01}Ga_{0.99}N$ is grown. The InGaN intermediate layer 20 can significantly reduce the diffusion of a p-type dopant (e.g., Mg in this example) from the p-type semiconductor layers to be grown thereon to the active layer 18, thus maintaining the high quality of the active layer 18.

Next, the temperature in the reaction furnace is raised to around 1,000° C. again, hydrogen is also supplied as an additional carrier gas, and biscyclopentadienyl magnesium ($Cp_2Mg$) gas is supplied as a p-type dopant gas, thereby growing a p-type AlGaN cap layer 22 made of $Al_{0.20}Ga_{0.80}N$ with an Mg concentration of approximately $1\times10^{19}$ $cm^{-3}$ to a thickness of approximately 20 nm.

Thereafter, a second GaN optical guide layer 24 made of p-type GaN with an Mg concentration of approximately $1\times10^{19}$ $cm^{-3}$ is grown to a thickness of approximately 20 nm. Subsequently, a p-type AlGaN cladding layer 26 made of $Al_{0.05}Ga_{0.95}N$ with a dopant concentration of approximately $1\times10^{19}$ $cm^{-3}$ is grown to a thickness of approximately 0.5 μm. Finally, a p-type contact layer 28 with an Mg concentration of approximately $1\times10^{20}$ $cm^{-3}$ is grown to a thickness of approximately 0.1 μm.

Hereinafter, the processing step of forming a p-side electrode on the upper surface of the semiconductor multilayer structure will be described with reference to FIGS. 2 and 3. First, an insulating film is deposited over the upper surface of the semiconductor multilayer structure with a plasma CVD system, for example. This insulating film is preferably made of a material such as $SiO_2$ that has a high degree of dry etch resistance so as to make a dry etch mask. Thereafter, the insulating film is patterned into a stripe shape with a width of 1.5 μm by performing a photolithographic process and a hydrofluoric acid treatment in combination. Subsequently, using the striped insulating film as a dry etch mask, the p-type semiconductor layers are patterned into a ridge shape with a dry etching system and then the remaining portion of the ridge-like insulating film is removed by a hydrofluoric acid treatment.

Next, an $SiO_2$ layer 30 is deposited over the upper surface of the semiconductor multilayer structure with the ridge, and then only a portion of the $SiO_2$ layer 30 that is located on the ridge is removed by performing a photolithographic process and a hydrofluoric acid treatment in combination. After that, a p-side contact electrode (Pd/Pt) 32 is formed so as to run parallel to the ridge and to cover the upper and side surfaces of the ridge. More specifically, a resist mask with a striped opening right over the ridge is defined by a photolithographic process and then Pd and Pt are deposited thereon in this order by an evaporation process. Thereafter, the resist mask and the excessive portions of Pd and Pt on the resist mask are lifted off, thereby forming the p-side contact electrode 32 shown in FIG. 3.

Next, a p-side interconnect electrode (Ti/Pt/Au) 34 is formed so as to cover the surfaces of the p-side contact electrode 32. Specifically, Ti, Pt and Au are deposited in this order by an evaporation process. In this process step, the p-side interconnect electrode 34 should have a recessed portion 40 so as to expose a part of the p-side contact electrode 32 as shown in portion (a) of FIG. 3. That is to say, the majority of the p-side contact electrode 32 is covered with the p-side interconnect electrode 34 but just a part of the p-side contact electrode 32 is not covered with the p-side interconnect electrode 34 but functions as a p-side contact electrode exposed portion 38. In the example illustrated in portions (a) and (b) of FIG. 3, a part of the p-side contact electrode 32 that protrudes horizontally a little from one side of the ridge (which will be referred to herein as a "ridge bottom portion") functions as the p-side contact electrode exposed portion 38.

By adopting such an arrangement, the p-side interconnect electrode 34 and that portion of the p-side contact electrode 32 that is exposed through the p-side interconnect electrode 34 have mutually different surface colors and have their contrast enhanced. As a result, the yield of the automatic mounting process can be increased significantly and the cost can be reduced greatly as will be described later.

Finally, an Au wire is connected onto the p-side interconnect electrode 34 with a ball bonder, for example, in order to supply current thereto. Optionally, if the Au wire is connected onto the insulating film 30 of $SiO_2$ on the bottom of the ridge, then the damage to be caused when the gold wire is connected with the ball bonder will not be directly done on the upper portion of the ridge that functions as a current supply path. As a result, a highly reliable laser diode can be fabricated with little damage done on the active layer.

Hereinafter, the process step of forming an n-side electrode 36 and the process step of dividing the wafer into laser chips will be described with reference to FIGS. 4(a) and 4(b). First, the back surface of the n-type GaN wafer 10 is polished to reduce the thickness of the n-type GaN wafer 10 to around 100 μm. Next, the polished surface is cleaned by wet and dry etching processes, for example, and respective metal layers of Ti, Pt and Au are deposited continuously in this order on the wafer, thereby forming an n-side electrode 36.

Thereafter, only the uppermost Au layer of the n-side electrode 36 is selectively removed by a wet etching process. This should be done for the following reason. Specifically, in the subsequent process step of cleaving the wafer into respective chips, Au deposited portions are hard to cleave just as intended because Au has a high degree of viscosity. For that reason, if Au is selectively removed from some regions and then those regions are subjected to primary and secondary cleavage processes, the yield of cleavage can be increased.

Then, the n-type GaN wafer 10 is subjected to the primary cleavage process along the M-plane thereof using scribe and braking tools, thereby defining end facets for laser resonant cavities. In this process step, if primary cleavage guides 42 are provided by boring dotted scribe holes in the vicinity of the intersections between the primary and secondary cleavage processes using the scribe tool, the yield of the cleavage processes will be increased significantly. This should be done because the GaN wafer is a hexagonal one and would induce a cleavage shift toward an equivalent cleavage plane (i.e., the M plane) that is located in a 60 degree direction.

Subsequently, an end facet protective coating is deposited on the end facets of the laser resonant cavities using an ECR sputtering system, for example. Finally, the bars obtained by the primary cleavage process are subjected to the secondary cleavage process, thereby obtaining semiconductor laser diodes such as the one shown in FIG. 2 and portions (a) and (b) of FIG. 3.

Hereinafter, the mounting process step will be described with reference to FIG. 5.

Each of the laser chips obtained by dividing the wafer is automatically mounted on a sub-mount 46 of AlN and stem with solder 50. Since the GaN wafer has a hexagonal structure, it is very difficult to carry out the secondary cleavage process step of dividing the wafer into respective laser chips (each of which should have a rectangular parallelepiped shape) with a good yield. The reason is that as GaN crystals are hexagonal ones, the four corners of those chips are not always rectangular. Consequently, in making a semiconductor light-emitting element with a GaN substrate, if those chips obtained by the cleavage process were automatically positioned and mounted on sub-mounts by sensing the four corners of the chips, then the yield would be poor.

As the GaN substrate is transparent, the p-side electrode can be located even from the back surface of the substrate. For that reason, a junction-down mounting technique is often adopted such that the active layer that generates heat is brought closer to the heatsink. If the n-side electrode 36 is already present on the back surface of the GaN substrate, however, it is difficult to locate the p-side electrode and the yield of the mounting process would decrease significantly according to the junction-down technique.

Furthermore, as shown in FIGS. 6(a) and 6(b), by adopting the p-electrode arrangement described above (see portion (b) of FIG. 3), each laser chip has at least one p-side contact electrode exposed portion 38, and the p-side contact electrode exposed portion 38, the p-side interconnect electrode 34 and the SiO$_2$ layer 30 will have mutually different hue, saturation and/or lightness values and an optically sensible contrast will be produced among them. Consequently, the p-side contact electrode exposed portion 38 can be easily located with a camera provided for the mounting machine. As a result, it was discovered that the accuracy of mounting could be improved significantly by using the p-side contact electrode exposed portion 38 as a sort of alignment mark.

On top of that, it was also discovered that the yield of the mounting process could be increased and the cost could be cut down by leaps and bounds because the light-emitting end facet (i.e., the front end facet) and the reflecting end facet (i.e., the rear end facet) of the laser diode could be easily distinguished from each other by locating the p-side contact electrode exposed portion 38.

Optionally, instead of locating the p-side contact electrode exposed portion 38 by the difference in hue, saturation or lightness (i.e., by the difference in contrast), the p-side contact electrode exposed portion 38 may also be located by a difference in surface reflectance between the p-side interconnect electrode 34, the p-side contact electrode exposed portion 38 and the SiO$_2$ layer 30. Specifically, a laser beam may be radiated as a probe and its reflected light may be monitored to make an automatic recognition.

It should be noted that in this preferred embodiment, the yield of the mounting process is calculated basically by determining whether or not the rightward, leftward, forward or backward shift of the laser mounted with respect to the location of the sub-mount's solder falls within the range of ±5 μm.

Next, an Au wire 52 for supplying current is connected to the p-side interconnect electrode 34 as shown in FIG. 7. The Au wire 52 is also connected to the interconnect electrode 48 of the sub-mount that is electrically connected to the n-side electrode 36. In this case, the Au wire 52 connected onto the p-side interconnect electrode 34 and the p-side contact electrode exposed portion 38 are preferably arranged on two opposite sides of the ridge as shown in FIG. 7. This arrangement is preferred because if the impact of the wire bonding process to connect the Au wire 52 were conveyed to the p-side contact electrode exposed portion 38, then the p-side contact electrode 32 could peel off. Finally, to shield the laser chip from the external air, a cap with a laser beam passing glass window is welded with a high electric field press machine.

The semiconductor light-emitting device fabricated by the process of this preferred embodiment was energized at room temperature. As a result, the device achieved continuous wave oscillation at a threshold current of 30 mA and had a slope efficiency of 1.5 W/A and an oscillation wavelength of 405 nm. Also, since the p- and n-side electrodes reached even the end facets of the laser diode, the quantity of heat dissipated from around the end facets did not decrease so much, and therefore, the semiconductor light-emitting device could operate with good stability for 1,000 hours or more even at as high a temperature as 80° C. and with as high a power as 150 mW.

In the preferred embodiment described above, the p-side contact electrode exposed portion 38 is arranged inside the end facet of the resonant cavity (i.e., such that y>0 is satisfied in FIG. 7). Alternatively, the p-side contact electrode exposed portion 38 may also be arranged at the end facet of the resonant cavity (i.e., such that y=0 is satisfied in FIG. 7). If the exposed portion were located at the end facet, however, the surface area of that exposed portion would decrease as a result of the primary cleavage process. That is why it would improve the yield of mounting process more efficiently to arrange that exposed portion inside the end facet of the resonant cavity rather than at the end facet.

Also, in the preferred embodiment described above, the p-side contact electrode exposed portion 38 is arranged at the bottom of the ridge. This arrangement is preferred for the following reason. Specifically, considering that the p-side interconnect electrode 34 contributes to dissipating the heat generated by the laser operating, if the exposed portion 38 were arranged so as to reach the upper portion of the ridge, extra heat could be generated locally and would affect the reliability.

COMPARATIVE EXAMPLE FOR EMBODIMENT 1

Hereinafter, a comparative example for the nitride semiconductor device according to the first preferred embodiment of the present invention will be described with reference to FIG. 8.

The comparative example shown in FIG. 8 has the same configuration as the semiconductor laser device of the first preferred embodiment except that the p-side contact electrode 32 is entirely covered with the p-side interconnect electrode 34. The laser diode of this comparative example was mounted on a sub-mount and stem using the same automatic mounting machine as the one described above. As a result, the front and rear end facets were recognized erroneously and the yield of mounting decreased by about 2% compared to the first preferred embodiment described above. This is because the p-side interconnect electrode 34 also has the recessed portion 40 but the p-side contact electrode 32 is not exposed and there is little contrast when the laser diode is viewed from over it. In addition, since the GaN substrate is transparent, the n-side electrode 36 on the back surface of the GaN substrate can be seen through the recessed portion 40 of the p-side interconnect electrode 34, thus decreasing the contrast ratio and eventually causing a decline in the yield of mounting.

EMBODIMENT 2

Hereinafter, a second preferred embodiment of a nitride semiconductor device according to the present invention will be described with reference to FIG. 9.

The preferred embodiment illustrated in FIG. 9 has the same configuration as the semiconductor laser device as the first preferred embodiment described above except that the p-side contact electrode 32 is exposed under the p-side interconnect electrode 34 on the front and rear sides of the laser and that the two exposed portions are located on two opposite sides of the ridge.

The laser diode of this preferred embodiment was mounted on a sub-mount and stem using the same automatic mounting machine as the one described above. As a result, the yield of mounting increased by 4%. This is because as the contrast between the p-side interconnect electrode 34 and the p-side contact electrode exposed portions 38 can be sensed both on the front and rear sides with the ridge interposed, the ridge can be located more accurately.

As shown in FIG. 9, if the distances (x, y) from the respective end facets of the laser to the two p-side contact electrode exposed portions 38 are different, then the front and rear end facets can be distinguished more easily and the yield of the mounting process can be increased.

In this preferred embodiment, when the Au wire 52 is connected onto the p-side interconnect electrode 34, the connection point is preferably located far away from the p-side contact electrode exposed portions 38. As shown in FIG. 10, if x>y is satisfied, the Au wire 52 is preferably connected so as to face the p-side contact electrode exposed portion 38, which is located at the distance x, over the ridge.

Furthermore, according to this preferred embodiment, the number of combinations of the p-side contact electrode 32 and the p-side interconnect electrode 34 can be increased. The reason is as follows. Specifically, if the respective uppermost layers of the p-side contact and interconnect electrodes 32 and 34 are made of the same metal (e.g., even if the combination of the p-side contact and interconnect electrodes 32 and 34 is (Pd/Au, Ti/Pt/Au) or (Pd/Pt, Ti/Pt)), the color difference between the p-side contact and interconnect electrodes 32 and 34 is not distinct. Even so, as the p-side interconnect electrode 34 has multiple recessed portions 40 (on the front and rear sides with the ridge interposed), the color difference from the n-side electrode 36 can be sensed at multiple points through the transparent GaN substrate.

In the preferred embodiments described above, the p-side contact electrode 32 is supposed to consist of Pd and Pt layers and the p-side interconnect electrode 34 is supposed to consist of Ti, Pt and Au layers. However, this is just an example. Alternatively, the combination of the p-side contact and interconnect electrodes 32 and 34 may also be (Pd, Ti/Pt/Au).

EMBODIMENT 3

Hereinafter, a third preferred embodiment of a nitride semiconductor device according to the present invention will be described with reference to FIG. 11.

The preferred embodiment shown in FIG. 11 has the same configuration as the semiconductor laser device of the second preferred embodiment described above except that the p-side interconnect electrode has multiple recessed portions 40 on the same side of the ridge to define multiple p-side contact electrode exposed portions 38 on the same side of the ridge.

By adopting the arrangement of this preferred embodiment, the wire bonding process may be performed on either the right- or left-hand side of the ridge. As a result, the wire bonding points can be located more easily and the productivity can be increased effectively.

EMBODIMENT 4

Hereinafter, a fourth preferred embodiment of a nitride semiconductor device according to the present invention will be described with reference to FIG. 12.

The preferred embodiment illustrated in FIG. 12 has the same configuration as the semiconductor laser device of the first preferred embodiment described above except that the uppermost layer of the p-side interconnect electrode 34 is not made of Au. To enhance the contrast between the p-side contact electrode exposed portion 38 and the p-side interconnect electrode 34, the p-side contact and interconnect electrodes 32 and 34 may have any of the following combinations of layers:

TABLE 2

| Electrode | p-side contact electrode 32 | p-side interconnect electrode 34 |
|---|---|---|
| Combination #1 | Pd/Au | Ti/Pt |
| Combination #2 | Pd | Ti/Pt |
| Combination #3 | Ni/Au | Ti/Pt |
| Combination #4 | Ni/Pt/Au | Ti/Pt |

In this preferred embodiment, an Au-based pad electrode (Ti/Au) 54 needs to be provided on a portion of the p-side interconnect electrode 34 to connect an Au wire thereto.

In the preferred embodiments described above, the insulating film is supposed to be made of $SiO_2$. However, the insulating film does not have to be an $SiO_2$ film. Alternatively, the insulating film may be made of $Ta_2O_5$, $ZrO_2$ or any other suitable material that has a high refractive index that is close to that of GaN.

Also, in the preferred embodiments described above, a GaN wafer is used as an exemplary nitride semiconductor wafer. However, the nitride semiconductor wafer does not have to be made of GaN but may also be made of AlGaN, InGaN or any other suitable compound. Optionally, the wafer may even be an off-axis wafer, too.

INDUSTRIAL APPLICABILITY

The present invention can increase the yield of a mounting process to be performed on nitride semiconductor devices that are expected to be used as short-wave light sources, thus contributing to manufacturing highly reliable nitride semiconductor laser diodes with an increased yield and at a reduced cost.

The invention claimed is:

1. A nitride semiconductor light-emitting element comprising:
 a nitride-based semiconductor substrate including an n-type dopant;
 a semiconductor multilayer structure, which is arranged on the principal surface of the semiconductor substrate and which includes a p-type region, an n-type region and an active layer sandwiched between the p- and n-type regions;
 an insulating film, which has been deposited on the upper surface of the semiconductor multilayer structure and which has an opening;
 a multilayer p-side electrode, which is arranged over the upper surface of the semiconductor multilayer structure and which makes contact with a portion of the p-type region of the semiconductor multilayer structure at the opening of the insulating film; and
 an n-side electrode, which is arranged on the back surface of the semiconductor substrate,
 wherein the multilayer p-side electrode includes a first p-side contact electrode layer that contacts with the portion of the p-type region and a second p-side interconnect electrode layer that has been stacked on the first p-side contact electrode layer, and
 wherein part of the first p-side contact electrode layer is exposed under the second p-side interconnect electrode layer.

2. The nitride semiconductor light-emitting element of claim 1, wherein that part of the first p-side electrode layer that is exposed under the second p-side electrode layer is not located over the opening.

3. The nitride semiconductor light-emitting element of claim 1, wherein multiple parts of the first p-side electrode layer are exposed under the second p-side electrode layer.

4. The nitride semiconductor light-emitting element of claim 1, wherein the insulating film has a striped opening and multiple parts of the first p-side electrode layer are exposed under the second p-side electrode layer on two opposite sides of the opening of the insulating film.

5. The nitride semiconductor light-emitting element of claim 1, wherein the uppermost layer of the first p-side electrode layer has different hue, saturation and/or lightness from that of the second p-side electrode layer.

6. The nitride semiconductor light-emitting element of claim 1, wherein the respective uppermost layers of the first and second p-side electrode layers and the insulating film have mutually different reflectances.

7. A semiconductor light-emitting device comprising:
 a heatsink; and
 the semiconductor light-emitting element of one of claim 1, which is arranged on the heatsink.

8. The semiconductor light-emitting device of claim 7, wherein the semiconductor light-emitting element is mounted on the heatsink such that the back surface of its semiconductor substrate contacts with the heatsink.

9. A method for fabricating a nitride semiconductor light-emitting device, the method comprising the steps of:
 providing the nitride semiconductor light-emitting element of claim 1; and
 mounting the nitride semiconductor light-emitting element on a heatsink while sensing which part of the first p-side electrode layer is exposed under the second p-side electrode layer.

10. The method of claim 9, wherein the step of mounting includes mounting the nitride semiconductor element on the heatsink such that the back surface of its semiconductor substrate contacts with the heatsink.

* * * * *

UNITED STATES PATENT AND TRADEMARK OFFICE
CERTIFICATE OF CORRECTION

PATENT NO. : 7,880,192 B2  Page 1 of 1
APPLICATION NO. : 12/159786
DATED : February 1, 2011
INVENTOR(S) : Yoshiaki Hasegawa et al.

It is certified that error appears in the above-identified patent and that said Letters Patent is hereby corrected as shown below:

Title Page, Section (57), line 13 of Abstract, "the p-side contact electrode 2" should read
-- the p-side contact electrode 32 --.

Column 14, lines 23-24, "of one of claim 1" should read -- of claim 1 --.

Signed and Sealed this
Fifth Day of July, 2011

David J. Kappos
*Director of the United States Patent and Trademark Office*